United States Patent [19]
Nishiura et al.

[11] Patent Number: 5,355,123
[45] Date of Patent: * Oct. 11, 1994

[54] OVERHEATING DETECTION CIRCUIT FOR DETECTING OVERHEATING OF A POWER DEVICE

[75] Inventors: Masaharu Nishiura; Tatsuhiko Fujihira, both of Kawasaki, Japan

[73] Assignee: Fuji Electric Co., Ltd., Kawasaki, Japan

[*] Notice: The portion of the term of this patent subsequent to Dec. 3, 2008 has been disclaimed.

[21] Appl. No.: 796,266

[22] Filed: Nov. 21, 1991

Related U.S. Application Data

[63] Continuation-in-part of Ser. No. 553,340, Jul. 17, 1990, Pat. No. 5,070,322.

[30] Foreign Application Priority Data

| Nov. 26, 1990 | [JP] | Japan | 2-322143 |
| Sep. 10, 1991 | [JP] | Japan | 3-229238 |
| Nov. 8, 1991 | [JP] | Japan | 3-292581 |

[51] Int. Cl.$^5$ .............................. G08B 17/06
[52] U.S. Cl. .............................. 340/653; 307/310; 340/598; 361/103; 374/152; 374/178
[58] Field of Search .............. 340/653, 598; 357/28; 307/310; 361/103; 374/152, 178

[56] References Cited

U.S. PATENT DOCUMENTS

| 4,667,265 | 5/1987 | Stanojevic et al. | 361/103 |
| 4,730,228 | 3/1988 | Einzinger et al. | 374/178 |
| 4,854,731 | 8/1989 | Jenkins | 374/178 |
| 4,924,212 | 5/1990 | Fruhauf et al. | 340/598 |

FOREIGN PATENT DOCUMENTS

| 174686 | 3/1986 | European Pat. Off. . |
| 0240807 | 10/1987 | European Pat. Off. . |
| 306396 | 3/1989 | European Pat. Off. . |
| 409214 | 1/1991 | European Pat. Off. . |
| 3821460 | 4/1989 | Fed. Rep. of Germany . |

OTHER PUBLICATIONS

E. Habekotte', "Silicon Temperature Sensors," Bull. ASE/UCS 76 (1985) 5, 9 mars, pp. 272–276.
O. H. Schade, "Thermal Shutdown Circuitry," *RCA Technical Notes*, No. 1270, Mar. 2, 1981, pp. 1–3.
D. M. Embree, "Thermal Shutdown Circuit," *Technical Digest—Western Electric*, No. 72, Oct. 1983, pp. 15–16.
J. Proctor, *Temperature Transducer IC is Linear Over Wide Range*, Electric Design, Apr. 5, 1984, pp. 133–140.

*Primary Examiner*—Glen Swann
*Attorney, Agent, or Firm*—Spencer, Frank & Schneider

[57] ABSTRACT

An arrangement for detecting overheating of a power integrated circuit includes a power device integrated in a semiconductor substrate and an overheating detection circuit. The overheating detection circuit includes a reverse biased pn junction formed in the same semiconductor substrate as the power device and having a reverse leakage current flow which is temperature dependent, and a voltage converter formed in the same semiconductor substrate as the power device and coupled to the pn junction for producing a voltage depending on the reverse leakage current flow. A threshold circuit is connected for receiving the voltage and producing a signal when the voltage exceeds a threshold voltage to indicate that the power device is overheated.

6 Claims, 11 Drawing Sheets

OVERHEATING DETECTION CIRCUIT FOR DETECTING OVERHEATING OF A POWER DEVICE

The present application is a continuation-in-part of U.S. patent application Ser. No. 07/553,340, filed Jul. 17th, 1990, now U.S. Pat. No. 5,070,322, issued Dec. 3rd, 1991, the disclosure of which is incorporated herein by reference.

CROSS REFERENCE TO RELATED APPLICATIONS

The present application claims the rights of priority of Japanese Patent Application No. 2 - 322143, filed in Japan on Nov. 26th, 1990, Japanese Patent Application No. 3 - 229238, filed in Japan on Sep. 10th, 1991 and Japanese Patent Application No. 3 - 292581, filed in Japan on Nov. 8th, 1991, the subject matter of which is incorporated herein by reference.

BACKGROUND OF THE INVENTION

1. Field of the Invention

The present invention relates to an overheating detection circuit which is formed in the same semiconductor substrate as that of a power device in a power controlling integrated circuit (power IC), and which can detect an abnormal temperature of the power device.

2. Description of the Prior Art

A power IC includes a control region having a logic region and a power device which are formed in the same substrate. Because a power IC is used with high voltages and large currents, an abrupt increase in the consumption of electric power caused by an abrupt change in a load connected to the device or a short circuiting of the load can result in large currents in excess of the rated current flowing through the device, thereby creating a danger that the device will become excessively heated and, in an extreme case, that the device will be destroyed. To protect a power device against such thermal destruction, the temperature of the power device is constantly monitored and, when the temperature of the device exceeds a predetermined temperature or an overheating of the device is detected, some protective action is taken, for example, the power IC is turned-off.

In monitoring a power device, it is preferable to fabricate an overheating detection circuit including a temperature sensor into a substrate in which the power device is formed in order to improve temperature sensitivity and to simplify the circuit arrangement. Typically, however, discrete elements have been used for forming a circuit which interrupts operation of a power device upon detection of over currents or an overheating of the power device. In this connection, a thermal sensor using a bipolar transistor as a thermo-sensitive sensor is described in E. Habekotte', Bull, ASE/UCS 76 (1985) 5, 9mars, pp. 272-276.

FIG. 1 illustrates a circuit arrangement of an overheating detection circuit of the prior art which uses the thermal sensor described in the above-cited reference. As shown in FIG. 1, a bipolar transistor 91, operating as a thermal sensor, is inserted into a feedback loop of an operational amplifier 92. An external constant current source (not shown) supplies a collector current IC to the transistor 91. Operational amplifier 92 produces an output voltage $V_1$, which is equal in amplitude but of reverse polarity to a base-emitter voltage $V_{BE}$ of transistor 91. As shown in FIG. 2, the base-emitter voltage $V_{BE}$ varies linearly with and is inversely proportional to temperature T. By properly amplifying the output voltage $V_1$ of the operational amplifier 92 by another operational amplifier 94, an output voltage Vout which varies linearly with respect to temperature T can be obtained.

A feature of the above thermal sensor is that the output voltage Vout varies linearly with respect to change in temperature, and that little error exists over a broad range of temperature change. However, when the thermal sensor is assembled with a power IC as an overheating detection circuit, various problems are encountered. Because the circuit of FIG. 1 uses a constant current circuit with less temperature dependency and a comparator for comparison with the output voltage Vout, a relatively large amount of circuitry is required for the thermal sensor. Further, it is necessary to minimize the temperature dependency of the operational amplifiers 92 and 94, as well as a reference voltage source Vref. Otherwise, an error arising from the large temperature dependency of each of these components will adversely influence the detected temperature. To remove the adverse influence, most of the circuitry except the bipolar transistor 91 is fabricated and contained in a separate package which is placed at a location such that it is not influenced by the temperature of the power IC. Accordingly, when fabricating the overheating detection circuit in a power IC package, it is necessary to solve the problems associated with the substrate temperature and the increased size of the circuit.

The conventional thermal sensor provides an output signal which varies linearly over a broad range of temperature changes. To the contrary, the conventional overheating detection circuit is designed such that when the temperature of a power device reaches approximately 150°–180° C., it determines that the device temperature has reached an overheating temperature, and produces an output signal. Therefore, the overheating detection circuit must produce an output signal which must vary greatly in accordance with a relatively small temperature range. Thus, the performance requirements of the conventional thermal sensor and overheating detection circuit are quite different from each other.

SUMMARY OF THE INVENTION

Accordingly, an object of the present invention is to provide an overheating detection circuit comprising a simple circuit construction which is formed in the same substrate as that of a power device, and which can produce a large output signal in response to a detection of a temperature within a range of detection temperatures.

To accomplish the above object, according to a first aspect of the present invention, an overheating detection arrangement for detecting overheating of a power IC is provided which includes a power device integrated in a semiconductor substrate; and an overheating detection circuit comprising: a reverse biased pn junction formed in the same semiconductor substrate as the power device and having a reverse leakage current flow which is temperature dependent; voltage means formed in the same semiconductor substrate as the power device and coupled to the pn junction for producing a voltage depending on to the reverse leakage current flow; and threshold means connected to the overheating detection circuit for receiving the voltage and producing a signal when the voltage exceeds a threshold voltage to indicate that the power device is overheated.

According to a second aspect of the present invention, the above object can also be achieved by providing an overheating detection arrangement for detecting overheating of a power IC which includes a power device integrated in a semiconductor substrate; and an overheating detection circuit comprising: first and second temperature detecting circuits, the first temperature detecting circuit having a first temperature threshold and the second temperature detecting circuit having a second temperature threshold lower than the first temperature threshold, each of the first and second temperature detecting circuits including: a reverse biased pn junction formed in the same substrate as the power device and having a reverse leakage current flow which is temperature dependent; voltage means formed in the same substrate as the power device and coupled to the pn junction for producing a voltage depending on to the reverse leakage current flow; and threshold means connected to the voltage means for receiving the voltage and producing a signal when the voltage exceeds a threshold voltage corresponding to the respective threshold temperature; and hysteresis means receiving the signals produced by the respective threshold means of the first and second temperature detecting circuits for producing an overheating signal in response to the signal from the threshold means of the first temperature detecting circuit indicating that the power device is overheated and continuing to produce the overheating signal until the signal produced by the threshold means of the second temperature detecting circuit is discontinued.

The voltage means employed in the first and second aspects of the present invention as described above preferably comprises, a depletion type MOSFET (metal oxide semiconductor field effect transistor), a resistance layer, or an enhancement type MOSFET connected to high electric potential.

The reverse leakage current flowing in the reverse biased pn junction increases along with an increase in temperature of the substrate where the overheating detection circuit and the power device are formed. The leakage current is converted into a voltage depending on the leakage current by the voltage means. The converted voltage signal is checked to determine whether it is within the overheating temperature range by using the signal means having a threshold value. When the voltage signal reaches the overheating temperature range, the threshold means, preferably in the form of a comparator having a threshold voltage at one input with the voltage depending on the leakage current at the other input, produces an output (one value of a two-value signal) indicative of overheating. A protective measure against thermal destruction of the power device can then be taken, for example, a load connected to the power IC can be disconnected in accordance with the output of the comparator.

The overheating detection circuit of the present invention is formed with the logic region in the control region of the power IC and is thus in the same substrate as that of the power device. Various techniques are available to prevent a mutual interact ion between the control region and the power device, including, for example, a dielectric isolation method utilizing insulation film, a junction isolation method utilizing a pn junction and a self-isolation method utilizing the pn junction of the device itself in which the device is controlled by the gate isolated with the substrate. The self-isolation method is preferred for reasons of economy.

The above and other objects, effects, features and advantages of the present invention will become more apparent from the following description of embodiments thereof taken in conjunction with the accompanying drawings.

BRIEF DESCRIPTION OF THE DRAWINGS

Further advantages of the invention will be apparent from a reading of the following description in conjunction with the accompanying drawings, in which.

DETAILED DESCRIPTION OF PREFERRED EMBODIMENTS

Figure 3:
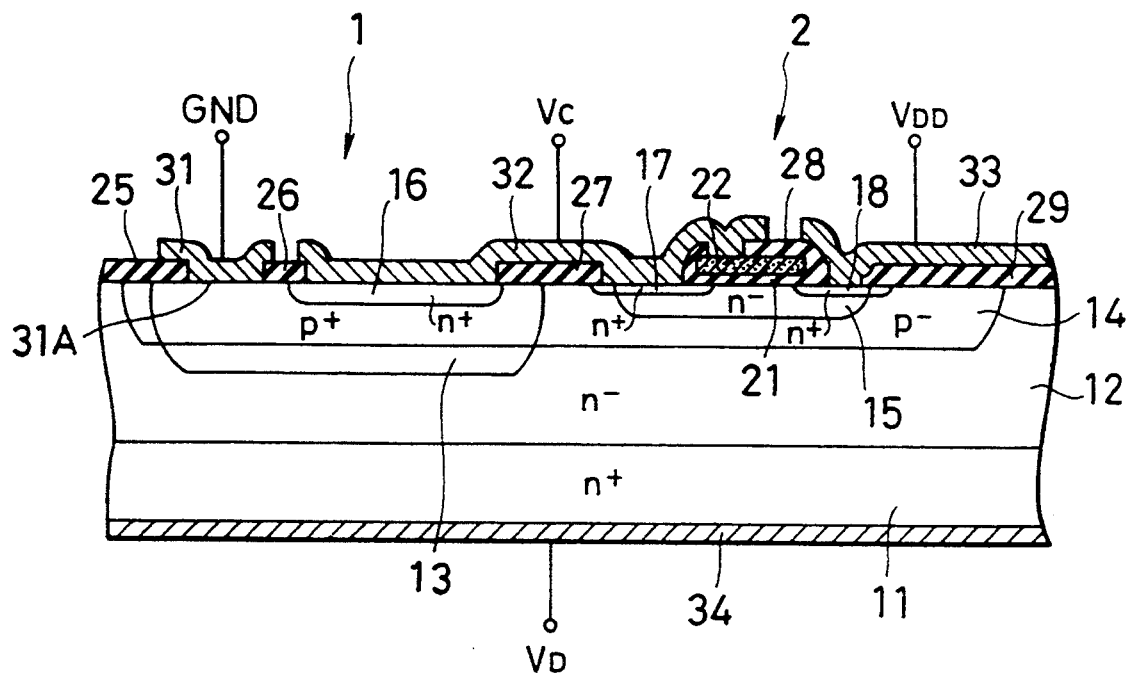
FIG. 3 is a cross-sectional view of an integrated circuit illustrating the junction structure of a first embodiment of an overheating detection circuit according to a first aspect of the present invention.
Figure 4:
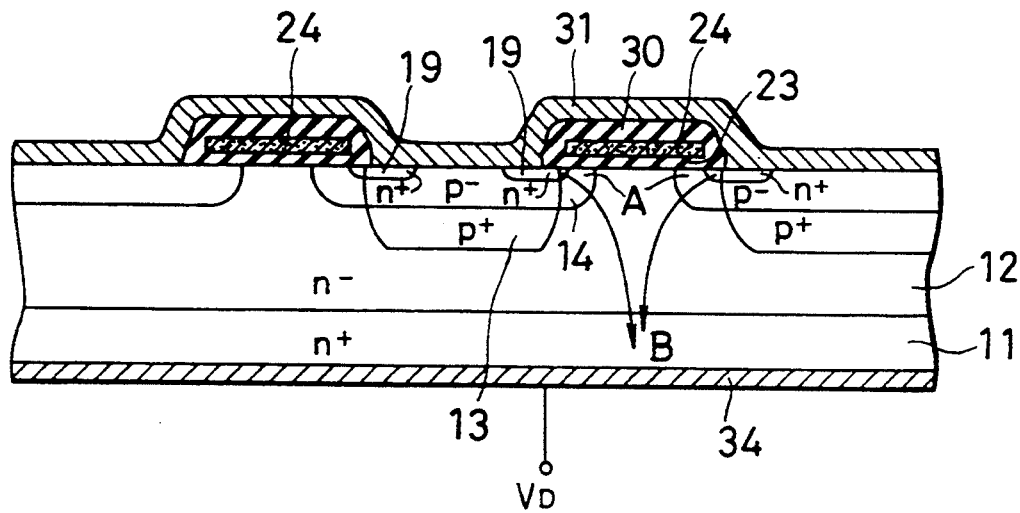
FIG. 4 is a cross-sectional view of a power device comprising a metal oxide silicon field effect transistor which is formed in the same semiconducting substrate as that of FIG. 3.

FIG. 3 is a cross-sectional view showing a semiconducting substrate where the overheating detection circuit according to a first embodiment of the present invention is formed in the same semiconducting substrate as that of a MOSFET forming the power device as shown in FIG. 4. In FIGS. 3 and 4, a p+ type diffused region 13, a p− type diffused region 14, an n− type diffused region 15 and n+ type diffused regions 16, 17, 18 and 19 are formed in a surface of an n− type epitaxial layer 12 formed on an n+ type substrate 11. A gate electrode 22 is formed by polycrystalline silicon on the surface between the n+ type diffused regions 17 and 18 through an insulating film 21.

In the power device shown in FIG. 4, a gate electrode 24 is formed by polycrystalline silicon on the surface between n+ type diffused region 19 in the p− type diffused region 14 and the exposed portion of the n− type diffused layer 12 through an insulating film 23.

Insulating films 25, 26, 27, 28, 29 and 30 are protective films for exposed junctions on the surface of the substrate and provide insulation between the diffused regions. An electrode 31 connected to a GND terminal contacts the p+type diffused region 13 through a contacting hole 31A in the insulating films 25, 26. The electrode 31 is electrically connected to the p− type diffused region 14 through the p+ type diffused region 13. An electrode 32 forms a connection between the n+ type diffused areas 16, 17, the gate electrode 22 and a VC terminal, and an electrode 33 forms a connection between the n+ type region 18 and a Vdd terminal. These electrodes 31, 32 and 33 are made of metal. A metallic drain electrode 34 contacts n+type substrate 11 on the opposite side of the substrate and is connected to an output terminal $V_D$. The junction means of the present invention comprises the p+ type region 13 and the n+type region 16. The voltage means in this embodiment of the present invention is constituted of a depletion type MOSFET 2. The depletion type MOSFET 2 comprising of the n+ type regions 17, 18, the n− type region 15, the p− type region 14 and the electrode 22 produces a voltage depending on a temperature dependent reverse leakage current flow in the pn junction formed by regions 13 and 16. The power device implemented by the MOSFET shown in FIG. 4 operates in a known manner. That is, when a positive voltage more than a threshold level is applied to the gate electrode 24 while a positive voltage is applied to the drain electrode 34, an n channel is produced by inversion of polarity on the surface A of each p− diffused region 14, between the n+ type layer 19 and n− type layer 12 just under the insulating film 23, thereby causing a conductive state by injecting electrons into the drain electrode 34 from the electrode 31 through the source areas 19, the n channel, the n− layer 12 and n+ layer 11 as shown by the arrow B. Therefore, the electric potential of the output terminal Vd having more than 100 to 200 V at the OFF state drops to near GND potential.

Figure 1:
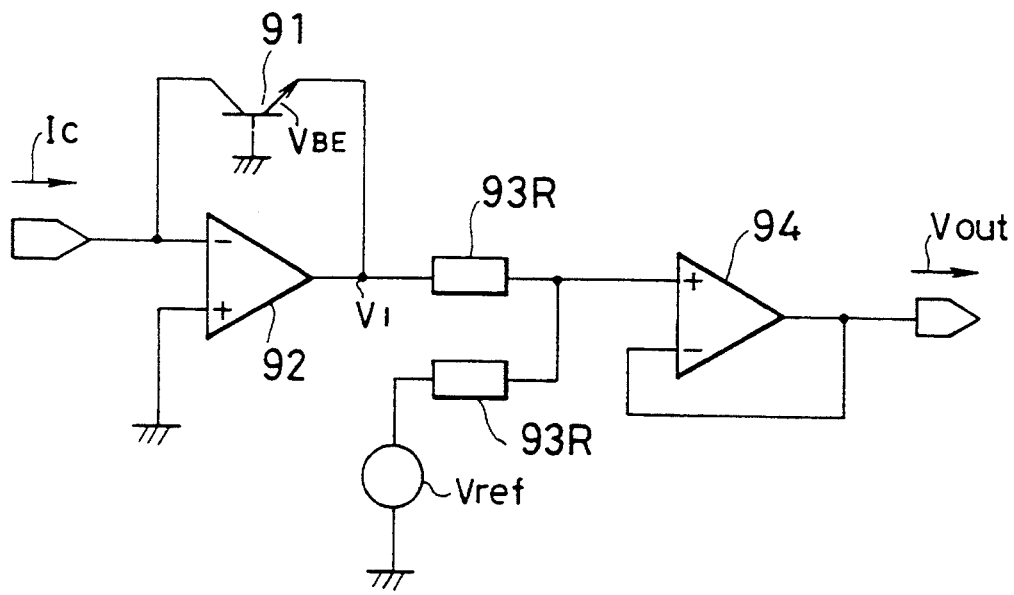
FIG. 1 is a circuit diagram showing a conventional overheating detection circuit.
Figure 2:
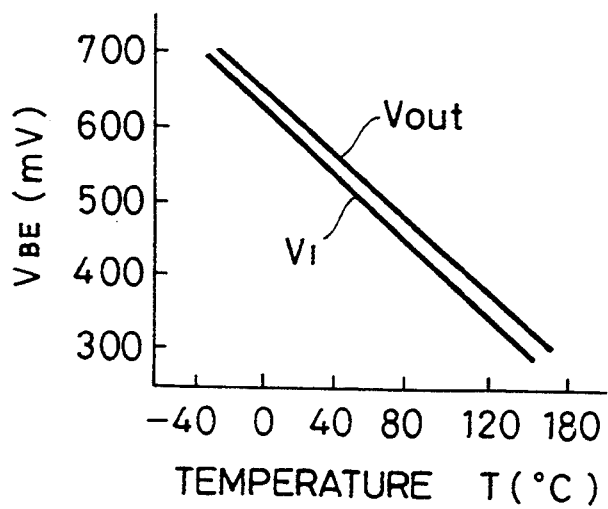
FIG. 2 is a graph showing $V_{BE}$ versus temperature characteristic curves useful for explaining the principle of the conventional overheating detection circuit of FIG. 1.

Next, the operation of the overheating detection circuit shown in FIG. 3 will be described. The reverse leakage current flowing in the reversely biased pn junction 1 increases along with the increase in the temperature of MOSFET as shown in FIG. 2. The leakage current is converted into a voltage having a greater temperature dependency by making use of static characteristics of a depletion MOSFET 2 which is connected to pn junction in series through the electrode 32. The converted voltage signal is output from the terminal Vc. A comparator (see FIG. 5) which constitutes the threshold means of the present invention is connected to the terminal Vc. Therefore, check is made as to whether or not the converted voltage signal is within the overheating temperature range by the comparator having a threshold value. When the voltage signal reaches the overheating temperature range, the comparator produces an output. A protection measure (not shown) against thermal destruction of the power device can be taken in which a load connected to the power IC is turned-off in accordance with the output of the comparator.

Figure 5:
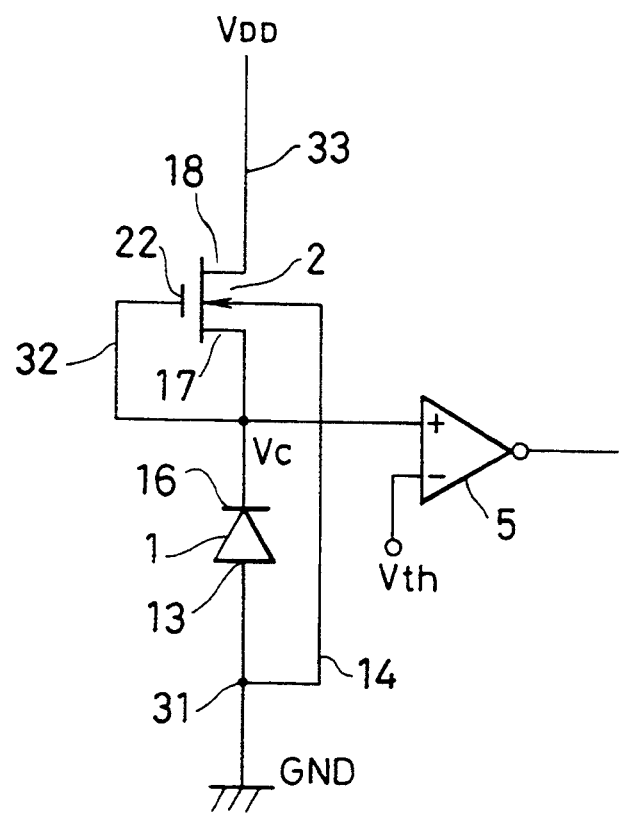
FIG. 5 is a circuit diagram of the first embodiment using the overheating detection circuit shown in FIG. 3.

FIG. 5 is a circuit diagram formed by utilizing the semiconductor structure shown in FIG. 3, and the same components as those in FIG. 3 are indicated by the same reference numerals. The diode 1 consisting of the p+ type region 13 and the n+ type region 16 is connected to the depletion type MOSFET 2 having the n+ type region 17 as source, the n+ type region 18 as drain and the gate electrode 22 in series. The mid-point between the diode 1 and the MOSFET 2 is connected to one input of a comparator 5 which has a threshold voltage $V_{th}$ at its other input.

Figure 6:
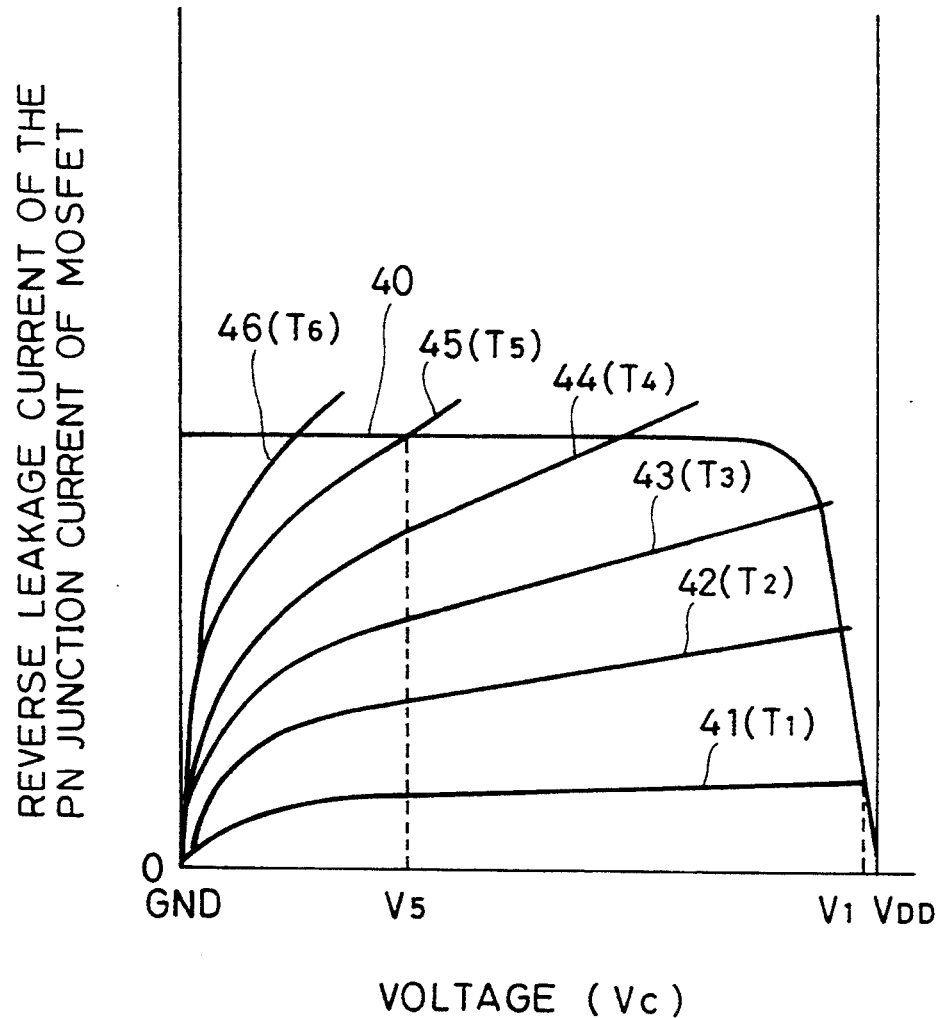
FIG. 6 is a graphical representation of variations of the reverse leakage current of the pn junction versus voltage at different temperatures, and variations of the current of the MOSFET versus voltage useful in explaining an operation of the circuit shown in FIG. 5.

Next, the operation of the overheating detection circuit shown in FIG. 5 will be described with reference to FIG. 6. In FIG. 6, curve 40 depicts a variation of the current of the MOSFET 2 with respect to the electric potential $V_c$ at the mid point between diode 1 and MOSFET 2. The variation of the current of MOSFET 2 is dependent on the form of MOSFET 2 or the concentration of the n− type region 15. Curves 41, 42, 43, 44, 45 and 46 depict a variation of the reverse leakage current of diode 1 with respect to variations of temperature from T1 to T6. The reverse leakage current varies depending on $\exp(-1/T)$, and is increased along with the increase in temperature. For example, the reverse leakage current, which is $50 \times 10^{-15}$ A at 15° C., increases to 200 nA at 175° C. The reverse leakage current also varies depending on the pn junction area. The electric potential $V_c$ is determined by points where the curve 40 intersects the curves 41–46 at the respective temperatures, so that for example the voltage $V_c$ is at $V_1$ at temperature T1 and varies to $V_5$ at T5. Comparator 5, having a threshold voltage $V_{th}$, produces a detecting signal Vout having one h value when the electric potential $V_c$ is lower than the threshold voltage $V_{th}$, and a second value when $V_c$ exceeds the threshold voltage. Therefore, if a control signal derived from the detecting signal Vout is input to the gate electrode of the power device shown in FIG. 4 through a logic circuit (not shown) determining a priority between the control signal and the driving signal of the power device, the power IC can be protected from thermal destruction.

As mentioned above, since the electric potential of the output terminal $V_D$ of the power circuit is changed by the ON-OFF switching of the MOSFET (FIG. 4), errors occur in the detected temperature due to the output voltage potential. That is, the temperature tends to be detected lower than the real temperature when the output voltage is near GND potential by a turning ON of the MOSFET. This is caused by the current amplification of the parasitic transistor formed by n+ type region 16, p+ type region 13 and n− type layer 12.

Figure 7:
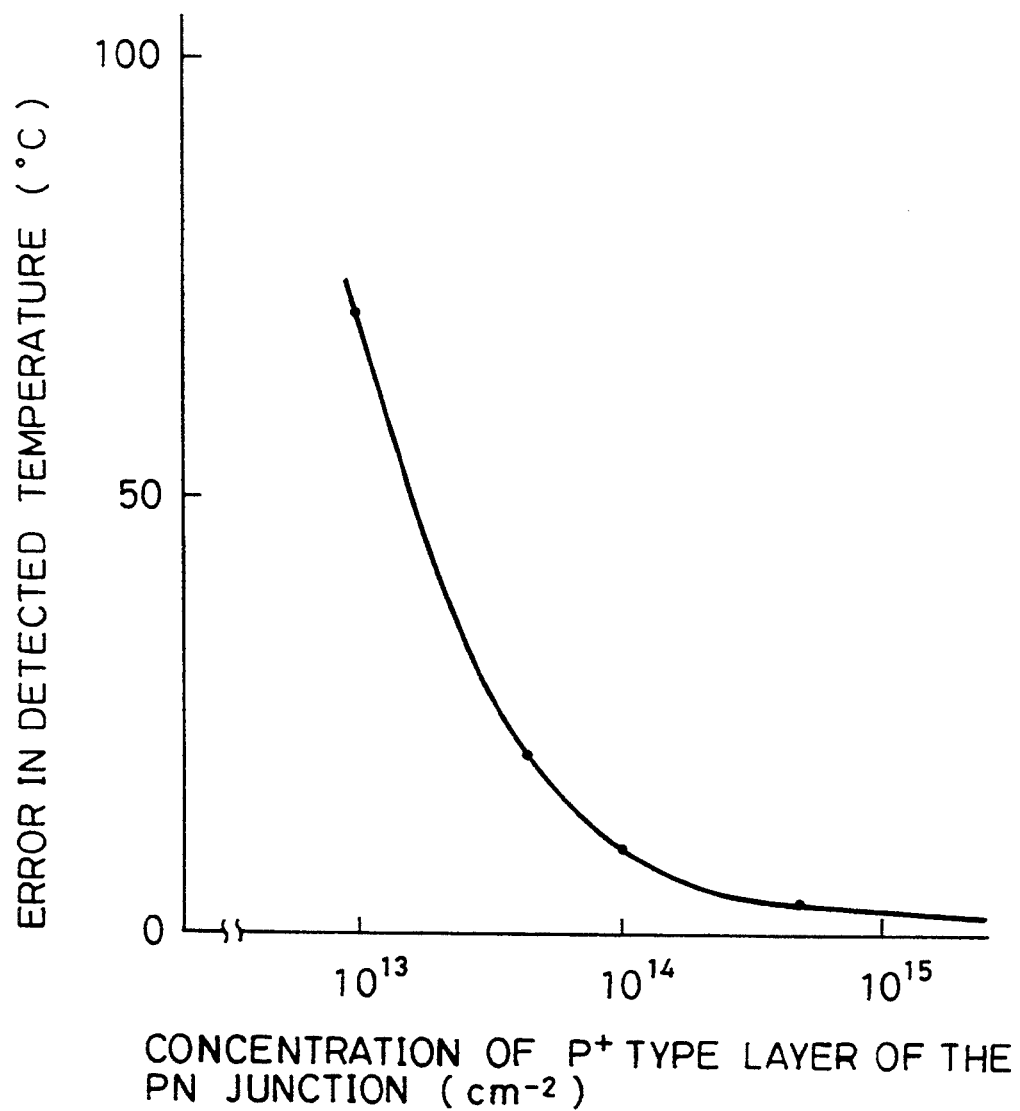
FIG. 7 is a graphical representation of variations of a doping concentration of the p+type layer of the pn junction versus error in detected temperature.

FIG. 7 is a curve showing the development of the error in the detected temperature as a function of concentration of the impurities. As seen, the error in the detected temperature can be suppressed if the parasitic transistor current gain $h_{FE}$ is suppressed by increasing the concentration of p+ type layer 13. Although it depends on the design of the controlling circuit for the power device, a practical overheating detection circuit can be obtained by increasing the concentration of p+ type layer 13, which is on the side of the low impurity concentration layer of the pn junction, to not less than about $5 \times 10^{13}/cm^2$, preferably about $3 \times 10^{14}/cm^2$.

Figure 8:
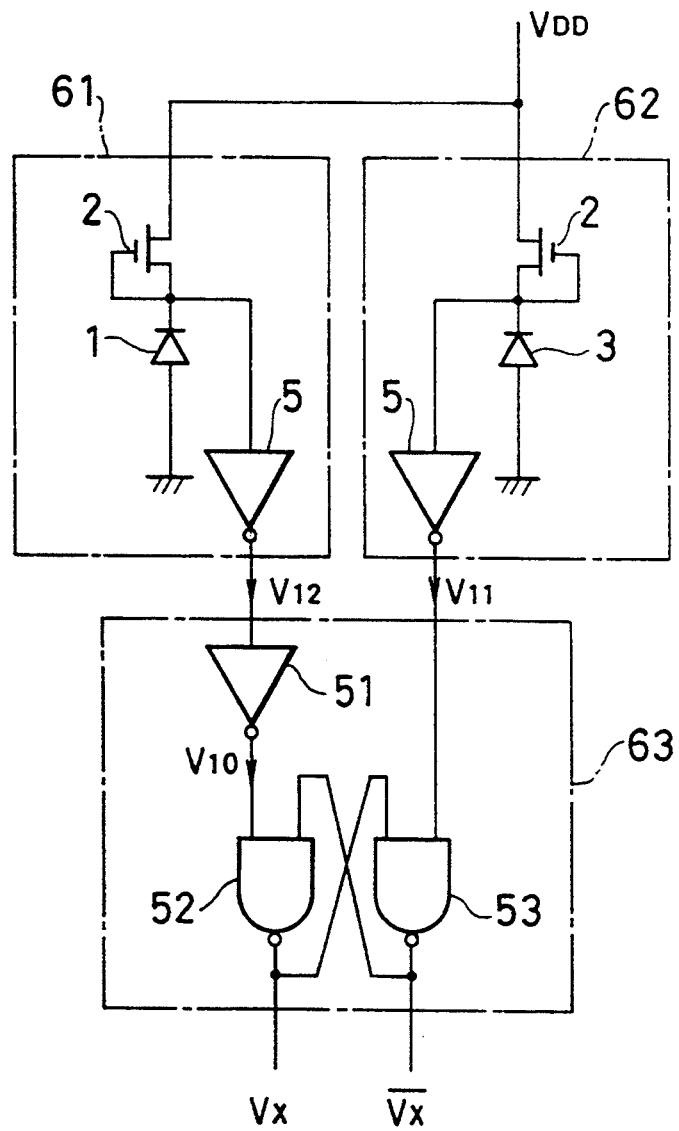
FIG. 8 is a circuit diagram of an embodiment using an overheating detection circuit according to the second aspect of the present invention.

As shown in FIG. 8, the overheating detection circuit according to a second aspect of the present invention comprises a first detecting circuit 61 and a second detecting circuit 62 each having circuit arrangements resembling that of the first aspect of the invention (e.g., FIG. 3), and a hysteresis circuit 63 for receiving output signals $V_{11}$ and $V_{12}$ of the first and second detecting circuits 61 and 62. Diode 1 and FET 2 of detecting circuit 61 and diode 3 and FET 2 of detecting circuit 62 are formed in the same semiconducting substrate as that of the power device shown in FIG. 4. Inverter 5 in each detecting circuit 61, 62 may be integrated in the same substrate if desired. The hysteresis circuit 63 comprises an inverter 51 for inverting the output signal $V_{12}$ of the first detecting circuit 61, and NAND gates 52 and 53 coupled with each other in a feedback manner. The NAND gates 52 and 53 receive the output signal $V_{11}$ of the second detecting circuit 62 as a reset signal, respectively, and output a composite signal $v_x$ and an inverted signal $\overline{V}$, respectively. In the circuit arrangement of FIG. 8, a difference of the detecting temperatures between the detecting circuits 61 and 62 is set by properly selecting a junction area of the pn junctions 1 and 3. For instance, if the ratio of the junction area of the diode 1 to that of the diode 3 is 1:4 to 1:5, a temperature difference is produced between the first detecting circuit 61 having the detection temperature of 180° C. and the second detecting circuit 62 having the detection temperature of 155° C.

An operation of the overheating detection circuit shown in FIG. 8 will now be described. A threshold voltage of inverter 5 in the first and second detecting circuits 61 and 62, respectively is set to a value corresponding to an overheating detection temperature. The junction area of diode 3 in second detecting circuit 62 is larger than the junction area of diode 1 in first detecting circuit 61 such that detecting temperature T2 of the second detecting circuit 62 is lower than that of the first detecting circuit 61. The temperature rises, passing through threshold temperature T2, and reaches the overheating detection temperature T1 of the first detecting circuit 61. The inverter 51 changes the logic state of its output signal from logic "1" to logic "0". The NAND gates 52 and 53, when receiving the output of inverter 51 at the set terminal, change logical states of the output signals such that the output signal $V_x$ is set to logic "1" and the signal $\overline{V}$ is set to logic "0". The changed logic states of the output signals $V_x$ and $\overline{V}$ the NAND gates 52 and 53 are maintained even at the point where the temperature is below the detection temperature within the difference ΔT (T1−T2), and the output signal $V_{10}$ of the inverter 51 changes its logic state . Next, the temperature drops to the detection temperature T2 of the second detector 62. The second detector 62 detects this and changes the logic state of its output signal to logic "1". At this time, the output signal $V_x$ goes low (logic "0") , and the inverted output signal $\overline{V}$ goes high. Then, the hysteresis circuit 63 is again placed in the reset state.

As described above, in the overheating detection circuit of FIG. 8, the two temperature detectors 61 and 62 have the two detection temperatures T1 and T2, respectively, and therefore, the preset temperature difference ΔT is provided. The hysteresis circuit 63 performs a hysteresis operation on the basis of the temperature difference ΔT. Therefore, irregular and short period variations in the temperature T of the power device due to a variation of the load at temperatures near the overheating detection temperature, can be ignored as temperature noise. This fact implies that in an overheating state, the power device can be stably held in the off state in accordance with the output signal $V_x$ and the inverted output signal $\overline{V}$. With this reference, adverse effects due to unnecessary protection operations on the load circuit, and electromagnetic noise can be reduced. The resultant overheating protection function is reliable.

Figure 9:
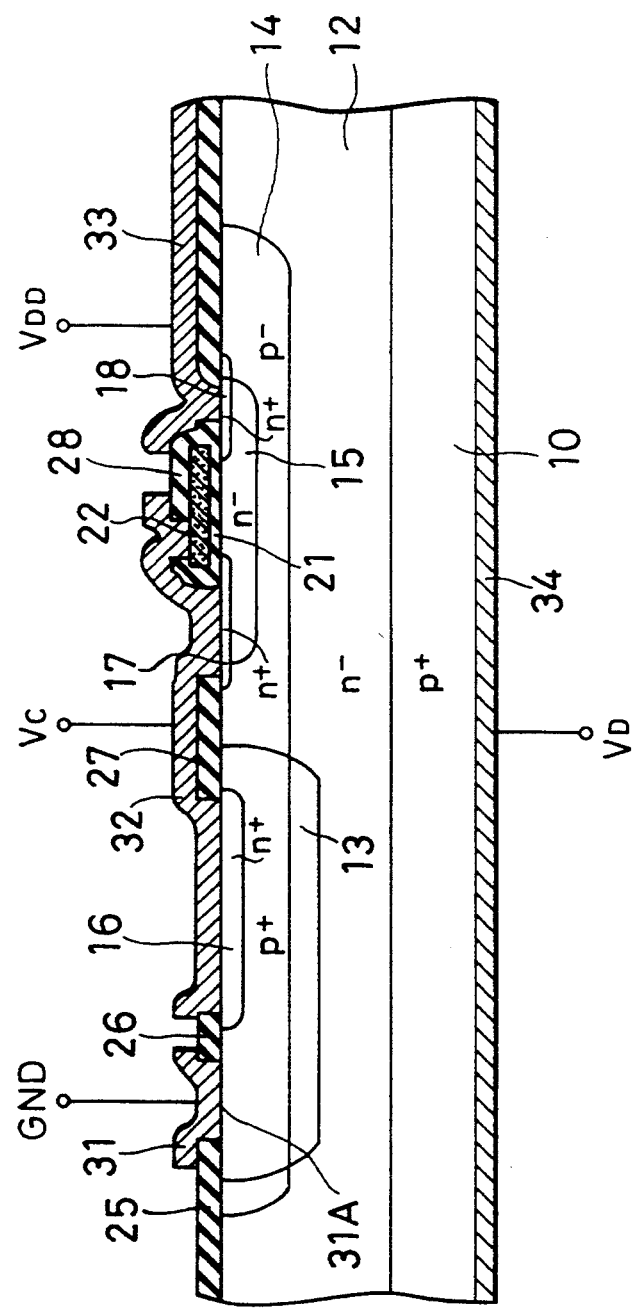
FIG. 9 is a cross-sectional view of an integrated circuit showing the junction structure of an overheating detection circuit according to the first aspect of the present invention where the power device to be formed in the same semiconducting substrate is an insulated gate bipolar transistor (IGBT)

FIG. 9 is a cross-sectional view showing a semiconducting substrate where the overheating detection circuit according to a first embodiment of the present invention is intended to be formed in the same semiconductor substrate as that of a power device (not shown) comprising an insulated gate bipolar transistor (IGBT, IGT or COMFET). In this embodiment, although the p+ type substrate 10 is utilized instead of the n+ type substrate 11 in FIG. 3, the diode consisting of p+ type region 13 and n− type layer 12 as well as the MOSFET consisting of n− type region 15, n+ type region 17, 18 and the gate electrode 22 can be manufactured through the same process steps as in FIG. 3. In addition, the embodiments of the present invention shown in FIG. 3 and FIG. 9 can be applied to a p channel insulated gate type power device with reversed conductive type. In that case, GND is changed to maximum electric potential.

As an alternative to the embodiments in which a depletion type MOSFET is utilized as the voltage conversion means, a resistance or an enhancement type MOSFET may be utilized as the voltage conversion means. In this case, since an n− type layer, n+ type layer or polycrystalline silicon layer are utilized as the resistance, they can be manufactured through similar process steps as in the depletion type MOSFET shown in FIG. 3.

Figure 10:
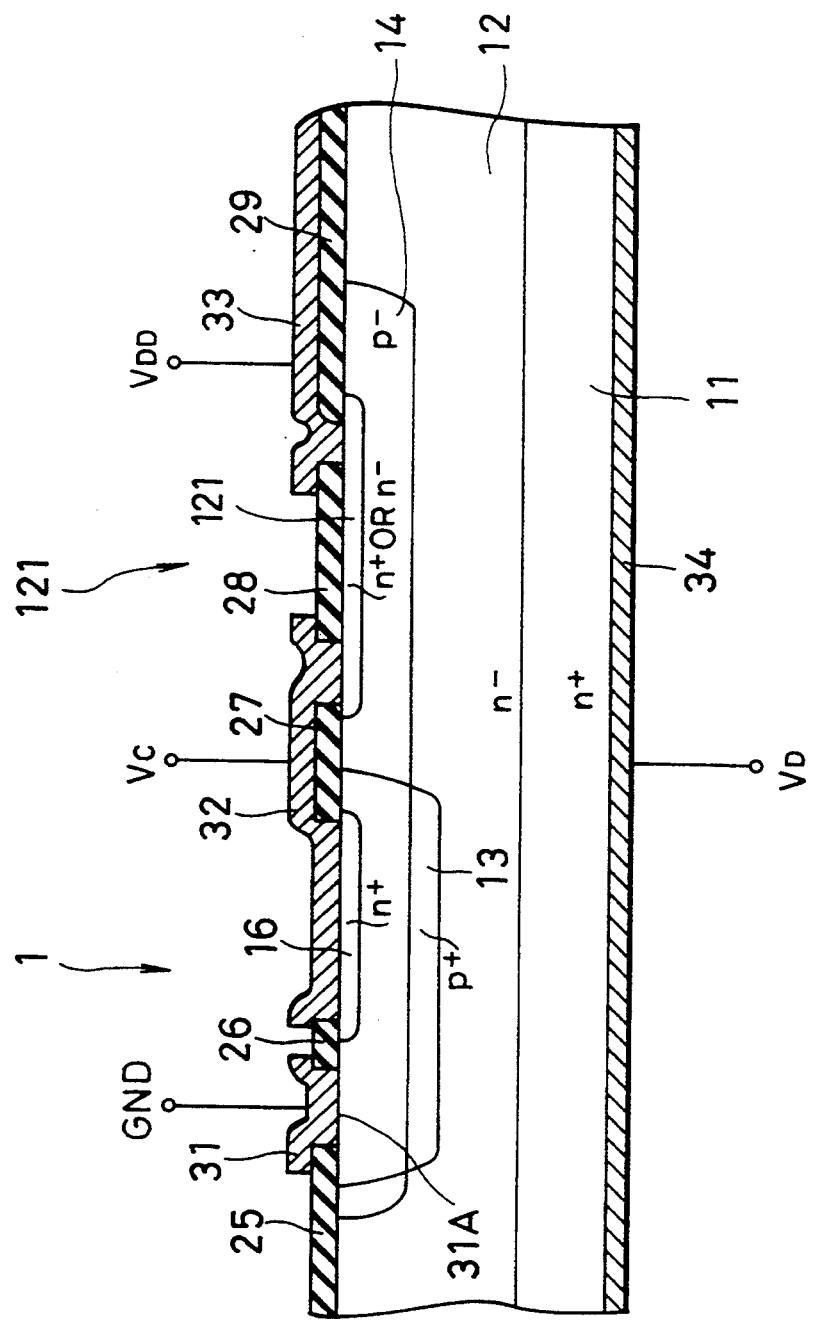
FIG. 10 is a cross-sectional view of an integrated circuit showing a second embodiment of the first aspect of the invention where a diffusion resistance layer is utilized as the voltage means for producing the voltage depending on the leakage current.
Figure 11:
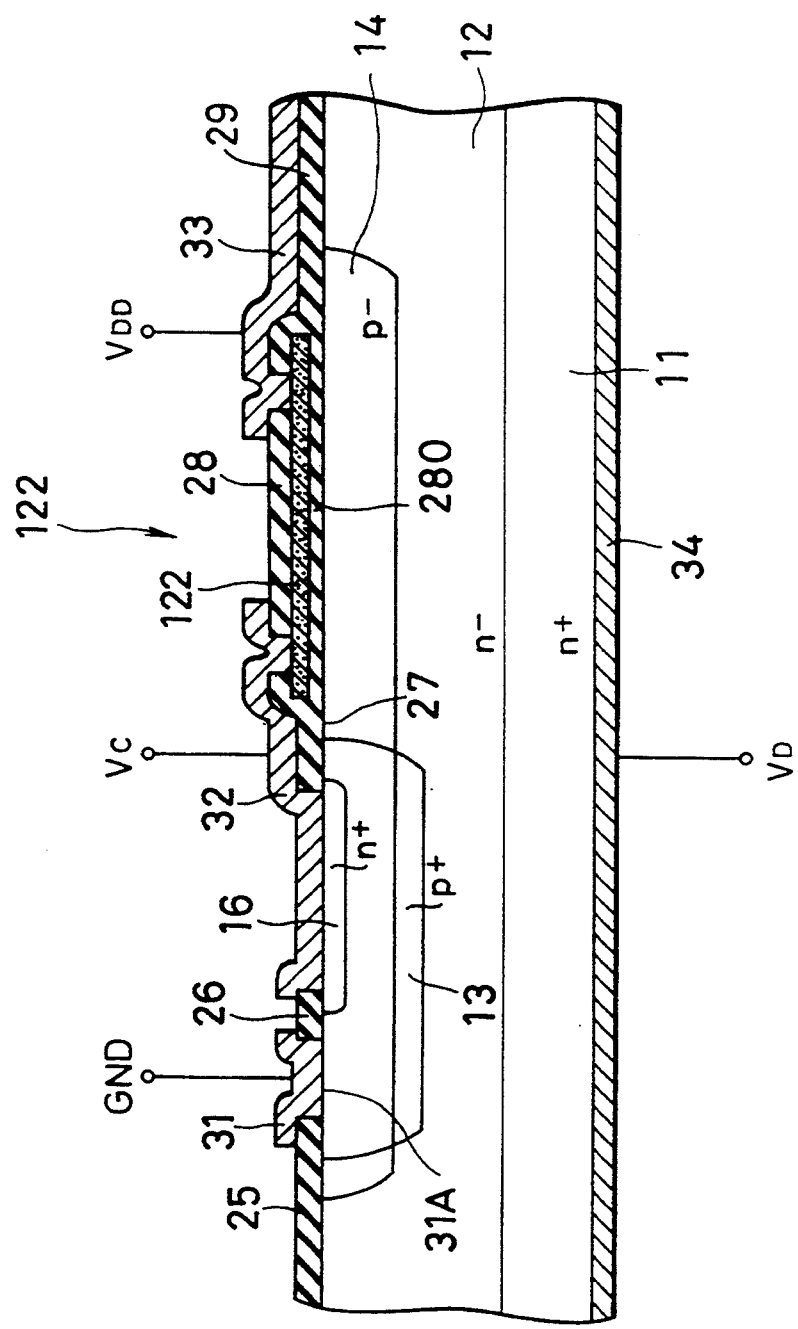
FIG. 11 is a cross-sectional view of an integrated circuit showing a third embodiment of the first aspect at the invention where a polycrystalline silicon resistance layer is utilized as the voltage means for producing the voltage depending on the leakage current.

FIG. 10 and FIG. 11 are cross-sectional views showing a semiconducting substrate where the overheating detection circuit according to another embodiment of the present invention is formed in the same semiconductor substrate as that of the MOSFET shown in FIG. 4.

FIG. 10 is a second embodiment of the first aspect of the invention where a diffusion resistance layer is utilized as the voltage means of the present invention. The overheating detection circuit according to the embodiment is formed in the same semiconducting substrate as that of the power device as shown in FIG. 4. FIG. 10, p+ type diffused region 13, p− type diffused region 14, nor n+ type diffused resistance region 121 and n+ diffused region 16 are formed in a surface of an n− type epitaxial layer 12 formed on an n+ type substrate 11. Insulating films 25, 26, 27, 28 and 29 are a protective film for exposed junctions on the surface of the substrate and provide insulation between the diffused regions. An electrode 31 connected to GND terminal contacts the p+type diffused region 13 through a contacting hold 31A. The electrode 31 is electrically connected to the p− type diffused region 14 through the p+ type diffused region 13. An electrode 32 forms a connection between the n+type diffused area 16, the diffused resistance region 121 and a Vc terminal and an electrode 33 forms a connection between diffused resistance region 121 and a Vdd terminal. These electrodes 31, 32 and 33 are made of metal. A metallic drain electrode 34 contacts the n+type substrate 11 and is connected to an output terminal Vd on the opposite side of substrate 11.

FIG. 11 is a third embodiment of the first aspect of the present invention where a polycrystalline silicon resistance layer is utilized as the voltage means of the present invention. This third embodiment mainly differs from the second embodiment shown in FIG. 10 in that the polycrystalline silicon resistance layer 122 contacting electrodes 32 and 33 is provided on p− diffusion region 14 through an insulating film 280 instead of the diffused resistance layer 121 in FIG. 10. In FIG. 10 and FIG. 11, a pn junction consisting of the p+ diffusion region 13 and n+ diffusion region 16 is equivalent to the reversely biased pn junction of the present invention.

Figure 12:
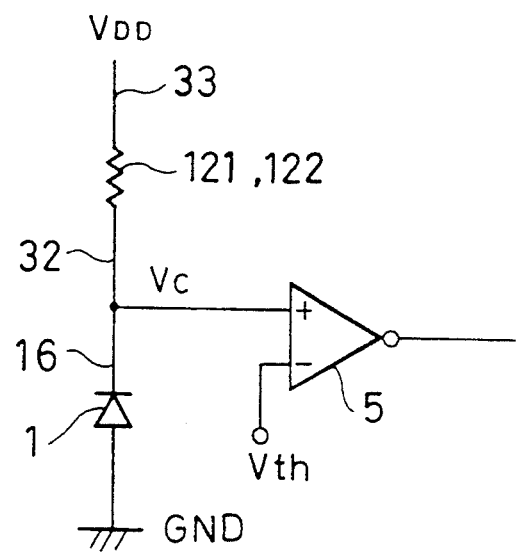
FIG. 12 is a circuit diagram of the second and third embodiments using the overheating detection circuit shown in FIG. 10 and FIG. 11.

FIG. 12 is a circuit diagram formed by utilizing the integrated circuit construction shown in FIG. 10 and FIG. 11, and the same component s as those in FIG. 10 and FIG. 11, are indicated by the same reference numerals. The diode 1 consisting of the p+ type region 13 and the n+ type region 16 is connected to the resistance layers 121, 122 having the electrode 32 at one end and the electrode 33 at another end in series. The mid-point between the diode and the resistance layer is connected to comparator 5 which may be implemented, for example, by a field effect transistor in a known manner.

Figure 13:
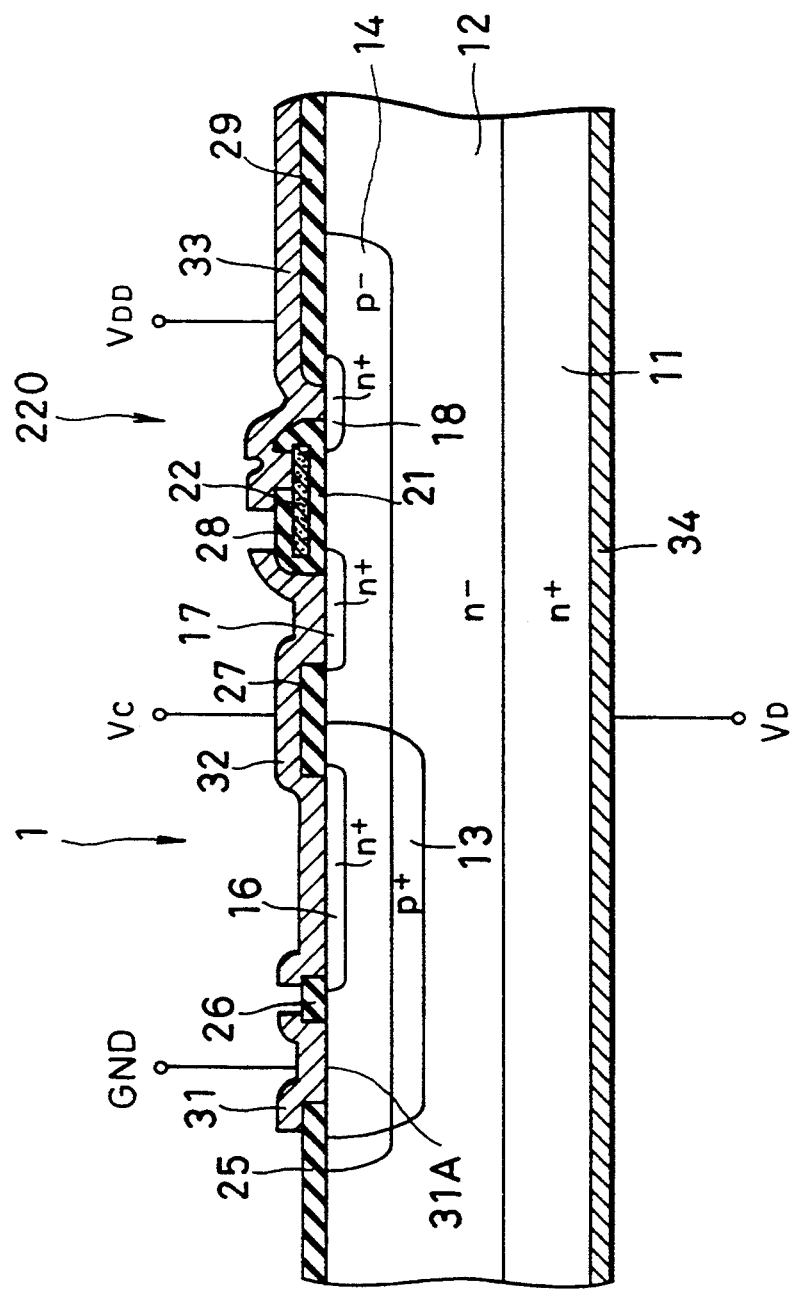
FIG. 13 is a cross-sectional view showing a fourth embodiment of the first aspect of the invention where an enhancement type MOSFET is utilized as the voltage means.

FIG. 13 is a cross section of an integrated circuit which shows a fourth embodiment of the first aspect of the invent ion wherein an enhancement type MOSFET 220 is utilized as the voltage means of the present invention. The overheating detection circuit according to this embodiment is formed in the same semiconducting substrate as that of the power device shown in FIG. 4.

Figure 14:
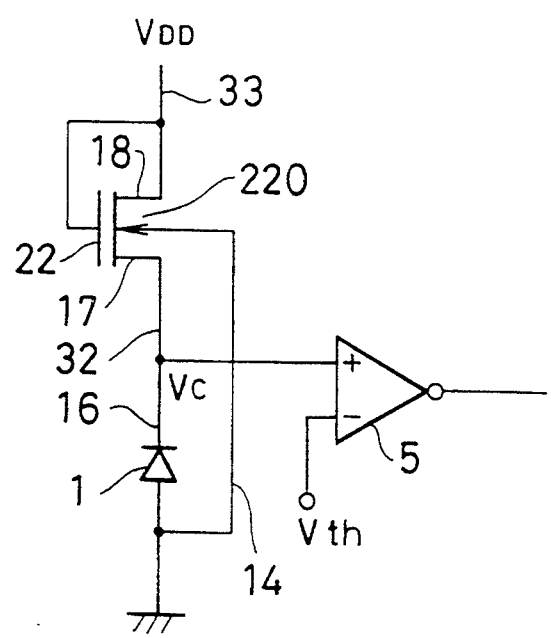
FIG. 14 is a circuit diagram using the forth embodiment of the overheating detection circuit shown in FIG. 13.

FIG. 14 is a circuit schematic of the integrated circuit of FIG. 13 and corresponds to the circuit of FIG. 3 wherein a p+ type diffused region 13, a p− type diffused region 14 and n+ diffused region and 18 are formed in a surface of an n− type epitaxial layer 12 on an n+ type substrate 11. A gate electrode 22 is formed on the surface between the n+ type diffused regions 17 and 18 through an insulating film 21 of polycrystalline silicon. Insulating films 25, 26, 27, 28 and 29 form a protective film for exposed junctions on the surface of the substrate and provide insulation between the diffused regions. An electrode 31 connected to GND terminal contacts the p+ type diffused region 13 through a contacting hole 31A. The electrode 31 is electrically connected to the p− type diffused region 14 through the p+ type diffused region 13. An electrode 32 forms a connection between the n+ type diffused areas 16 and 17 and a Vc terminal, and an electrode 33 forms a connection between the n+ diffused region 18, the gate electrode 22 and a Vdd terminal. These electrodes 31, 32 and 33 are made of metal. A metallic drain electrode 34 contact the n+ type substrate 11 and is connected to an output terminal $V_D$ on the opposite side of substrate 11. The junction means 1 of the present invention is constituted of the p+ type region 13 and the n+ type region 16 and the enhancement type MOSFET 220 as the voltage means of the present invention is constituted by the n+ type diffusion regions 17, 18 and electrode 22.

As mentioned above, the resistance or the enhancement type MOSFET shown in FIG. 10, FIG. 11 and FIG. 13 can be utilized as the voltage means instead of the depletion type MOSFET shown in FIG. 3. Although, by increasing the impurity concentration to not less than about $5 \times 10^{13}/cm^2$, preferably $3 \times 10^{14}/cm^2$, on the side of the low impurity concentration layer in the pn junction, the errors in the detected temperature can be suppressed while the power device is turning ON, there is a disadvantage in that any variation in voltage Vdd will cause the detected temperature to include errors. However, there are some advantages over the first embodiment from the view point of lower cost in that, for example, the process for accumulating a polycrystalline silicon to form the gate electrode 22 is omitted according to the second embodiment shown in FIG. 10 and the process for forming on n− type diffusion layer is omitted according to the third and forth embodiments shown in FIG. 11 and FIG. 13, respectively. The embodiments are thus selected depending on the purpose.

AS seen from the foregoing description, in an overheating detection circuit according to the present invention, a reverse leakage current of a reversely biased pn junction is converted into a voltage drop depending on the reverse leakage current by a voltage means. The voltage drop is converted into a corresponding 2-value signal by the threshold means such as a comparator or an inverter with a threshold value. The overheating detection circuit thus described is formed in a substrate in which a power device is also formed. By utilizing a larger temperature dependency of the reverse leakage current of the pn junction diode and the static characteristics of a depletion type MOSFET, a signal corresponding to a temperature change of the power device can be converted into a large voltage change. Therefore, a temperature detection of the overheating detection circuit is very sensitive particularly in the temperature range of 150° C.–180° C. In addition, since the overheating detection circuit and the power device are formed in the same substrate in the same step, a small, inexpensive power IC including an overheating detection circuit is provided.

In a further aspect of the invention, there is provided an overheating detection circuit comprising two detectors, each having a distinct detection temperature and a hysteresis circuit. Irregular and short period variations in the temperature of the power device due to a variation of the load at a temperature near the overheating detection temperature can be ignored as temperature noise if the temperature difference ΔT between the different detection temperatures is appropriately selected. Therefore, adverse effects due to unnecessary repetition of the protection operation, as well as electromagnetic noise caused by it can be eliminated. When an overheating temperature of a power device is detected, the operation of the power device is stopped and its restart is prohibited until it is confirmed that the overheating temperature drops to a temperature in a safety region which is below the lower end of the ΔT temperature range. Therefore, there is provided an overheating protection circuit which is stably, reliably, and safely operable.

In addition, by increasing the impurity concentration to not less than about $5 \times 10^{13}/cm^2$ on the side of the low impurity concentration layer in the pn junction, the errors for the detected temperature can be suppressed while the power device is turning ON.

It will be understood that the above description of the present invention is susceptible to various modifications, changes and adaptations, and the same are intended to be comprehended within the meaning and range of equivalents of the appended claims.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. An overheating detect ion arrangement for detecting overheating of a power integrated circuit, including:
   a power device integrated in a semiconductor substrate; and
   an overheating detection circuit, including:
      a reverse biased pn junction formed in the same semiconductor substrate as said power device and having a reverse leakage current flow which is temperature dependent;
      voltage means formed in said semiconductor substrate as said power device and coupled to said pn junction for producing a voltage depending on the reverse leakage current flow; and
      threshold means connected for receiving the voltage and producing a signal when the voltage exceeds a threshold voltage to indicate that said power device is overheated.

2. The arrangement as claimed in claim 1, wherein said voltage means comprises a depletion-type MOSFET connected for receiving a constant current.

3. The arrangement as claimed in claim 1, wherein said voltage means comprises an enhancement-type MOSFET.

4. An overheating detect ion arrangement for detecting overheating of a power integrated circuit, including:
   a power device integrated in a semiconductor substrate; and
   an overheating detection circuit comprising:
      first and second temperature detecting circuits, said first temperature detecting circuit having a first temperature threshold and said second temperature detecting circuit having a second temperature threshold lower than the first temperature threshold, each of said first and second temperature detecting circuits including:
         a reverse biased pn junction formed in the same semiconductor substrate as said power device and having a reverse leakage current flow which is temperature dependent;
         voltage means formed in the same semiconductor substrate as said power device and coupled to said pn junction for producing a voltage depending on the reverse leakage current flow; and
         threshold means connected to said voltage means for receiving the voltage and producing a signal when the voltage exceeds a threshold voltage corresponding to the respective threshold temperature; and
      hysteresis means receiving the signals produced by the respective threshold means of said first and second temperature detecting circuits for producing an overheating signal in response to the signal from the threshold means of said first temperature detecting circuit indicating that said power device is overheated and continuing to produce the overheating signal until the signal from the threshold means of said second temperature detecting circuit is discontinued.

5. The arrangement as claimed in claim 4, wherein each said voltage means comprises a depletion-type MOSFET connected for receiving a constant current.

6. The arrangement as claimed in claim 4, wherein each said voltage means comprises an enhancement-type MOSFET.

* * * * *